US010313766B1

(12) United States Patent
Leung et al.

(10) Patent No.: US 10,313,766 B1
(45) Date of Patent: Jun. 4, 2019

(54) APPARATUS FOR MATING A FIELD-REPLACEABLE UNIT TO A BACKPLANE OF A TELECOMMUNICATIONS SYSTEM

(71) Applicant: Juniper Networks, Inc., Sunnyvale, CA (US)

(72) Inventors: Jimmy Chun-Chuen Leung, Fremont, CA (US); Franklin D. Boyden, Pleasanton, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/640,492

(22) Filed: Jul. 1, 2017

(51) Int. Cl.
*H01R 13/627* (2006.01)
*H04Q 1/02* (2006.01)
*H01R 13/621* (2006.01)

(52) U.S. Cl.
CPC ......... *H04Q 1/155* (2013.01); *H01R 13/6215* (2013.01)

(58) Field of Classification Search
CPC .............. H01R 13/621; H01R 13/6215; H01R 13/639; H04Q 1/15; H04Q 1/155
USPC ........ 439/359, 361, 362, 364; 361/754, 823, 361/827, 829
See application file for complete search history.

(56) References Cited

U.S. PATENT DOCUMENTS

| | | | | |
|---|---|---|---|---|
| 3,898,815 A * | 8/1975 | Young | ..................... | E21B 17/07 175/297 |
| 5,647,758 A * | 7/1997 | Ichikawa | ........... | H01R 13/6215 439/362 |
| 7,056,144 B2 * | 6/2006 | Barsun | ..................... | G06F 1/183 439/362 |
| 8,083,528 B2 * | 12/2011 | Sakairi | ............... | H01R 13/2435 439/66 |
| 9,055,879 B2 * | 6/2015 | Selby | ..................... | H01R 13/11 |
| 9,723,745 B2 * | 8/2017 | Qi | ......................... | H05K 7/1489 |
| 9,788,454 B1 * | 10/2017 | Leung | .................... | H05K 7/186 |
| 2002/0001989 A1 * | 1/2002 | Friesen | .............. | H01R 13/6215 439/362 |
| 2003/0073337 A1 * | 4/2003 | Guo | .................... | H01R 13/6395 439/362 |
| 2004/0180568 A1 * | 9/2004 | Wu | ..................... | H01R 13/6215 439/362 |
| 2005/0032410 A1 * | 2/2005 | Huang | ............... | H01R 13/6215 439/362 |
| 2008/0248678 A1 * | 10/2008 | Tuerschmann | .... | H01R 12/7047 439/345 |
| 2009/0325401 A1 * | 12/2009 | Sakairi | ............... | H01R 13/2435 439/66 |

(Continued)

*Primary Examiner* — Harshad C Patel
(74) *Attorney, Agent, or Firm* — FisherBroyles, LLP

(57) ABSTRACT

The disclosed apparatus may include (1) a Field-Replaceable Unit (FRU) that (A) is designed to mate with a backplane of a telecommunications system and (B) facilitates communication among computing devices within a network and (2) at least one helical ejector that (A) is coupled to the FRU, (B) fastens to a housing of the telecommunications system to enable the FRU to mate with the backplane of the telecommunications system, and (C) includes at least one spring that, when the helical ejector is fastened to the housing of the telecommunications system, applies a force on the FRU that pushes the FRU toward the backplane of the telecommunications system. Various other apparatuses, systems, and methods are also disclosed.

19 Claims, 9 Drawing Sheets

(56) References Cited

U.S. PATENT DOCUMENTS

2014/0371568 A1* 12/2014 Selby .................... H01R 13/11
                                                        600/388

* cited by examiner

APPARATUS FOR MATING A FIELD-REPLACEABLE UNIT TO A BACKPLANE OF A TELECOMMUNICATIONS SYSTEM

BACKGROUND

Field-replaceable units (such as line cards) are often installed in telecommunications systems to facilitate communication among computing devices within a network. In this context, the term "field-replaceable unit" and its abbreviation "FRU" typically refer to modular devices that include one or more ports and/or interfaces that carry or forward traffic within a network and/or across multiple networks. For example, a router may include various Physical Interface Cards (PICs) and/or Flexible PIC Concentrators (FPCs) that facilitate communication among computing devices within a network and/or across multiple networks.

Unfortunately, FRUs often necessitate a certain degree of engineering tolerance to account for slightly different dimensions, properties, and/or specifications resulting from imperfections in the manufacturing process. As a result, some FRUs may fit differently than other FRUs within a telecommunications system. Such engineering tolerance and/or variance may lead some FRUs to demate and/or become disconnected from the backplane of the telecommunications system, potentially disrupting communications, impairing signal integrity, and/or impairing the performance and/or functionality of those FRUs and/or the telecommunications system.

The instant disclosure, therefore, identifies and addresses a need for improved and/or additional apparatuses, systems, and methods for preventing demate between FRUs and telecommunications systems.

SUMMARY

As will be described in greater detail below, the instant disclosure generally relates to apparatuses, systems, and methods for preventing demate between FRUs and telecommunications systems. In one example, an apparatus for accomplishing such a task may include (1) an FRU that (A) is designed to mate with a backplane of a telecommunications system and (B) facilitates communication among computing devices within a network and (2) at least one helical ejector that (A) is coupled to the FRU, (B) fastens to a housing of the telecommunications system to enable the FRU to mate with the backplane of the telecommunications system, and (C) includes at least one spring that, when the helical ejector is fastened to the housing of the telecommunications system, applies a force on the FRU that pushes the FRU toward the backplane of the telecommunications system.

Similarly, an FRU incorporating the above-described apparatus may include (1) a communications circuit that facilitates communication among computing devices within a network, (2) at least one connector that facilitates communicatively coupling the communications circuit to a backplane of a telecommunications system, and (3) at least one helical ejector that (A) fastens to a housing of the telecommunications system to enable the connector to communicatively couple the communications circuit to the backplane of the telecommunications system and (B) includes at least one spring that, when the helical ejector is fastened to the housing of the telecommunications system, applies a force on the FRU that pushes the connector toward the backplane of the telecommunications system.

A corresponding method may include (1) securing at least one spring to a helical ejector that fastens to a housing of a telecommunications system and (2) coupling the helical ejector to an FRU designed to mate with a backplane of the telecommunications system such that, when the helical ejector is fastened to the housing of the telecommunications system, the spring secured to the helical ejector applies a force on the FRU that pushes the FRU toward the backplane of the telecommunications system.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
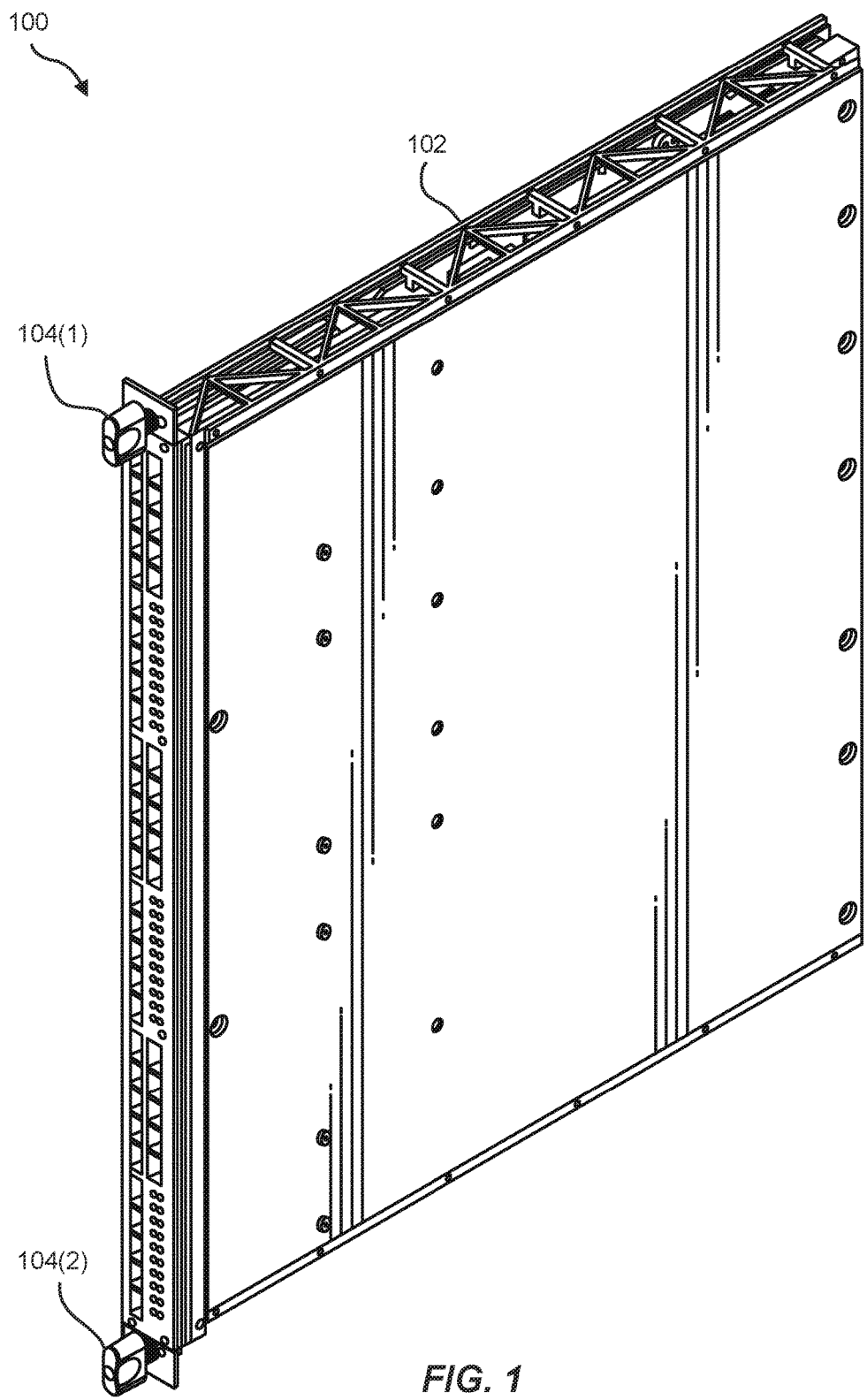
FIG. 1 is an illustration of an exemplary apparatus for preventing demate between FRUs and telecommunications systems.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for preventing demate between FRUs and telecommunications systems. As will be explained in greater detail below, embodiments of the instant disclosure may facilitate fastening an FRU to the housing of a telecommunications system by way of a helical ejector. In some embodiments, this helical ejector may include a spring that applies a force on the FRU. This force may push the FRU toward the backplane of the telecommunications system. By pushing the FRU toward the backplane in this way, the force may effectively prevent demate between the FRU and the backplane of the telecommunications system. Accordingly, embodiments of the instant disclosure may effectively safeguard, protect, and/or preserve communications and/or signal integrity, thereby improving the performance and/or functionality of FRUs and/or telecommunications systems.

The term "demate," as used herein, generally refers to any amount of gap and/or space that (1) exists between the connectors on an FRU and the backplane of a telecommunications system and (2) potentially impairs the signal integrity of communications exchanged between the FRU and the backplane of the telecommunications system. Similarly, the phrase "to demate" and/or "demating" as used herein, generally refers to the act of causing and/or experiencing demate.

The following will provide, with reference to FIGS. 1-8, examples of apparatuses and corresponding components that facilitate preventing demate between FRUs and telecommunications systems. In addition, an exemplary method for preventing demate between FRUs and telecommunications systems will be provided in connection with FIG. 9.

Figure 2:
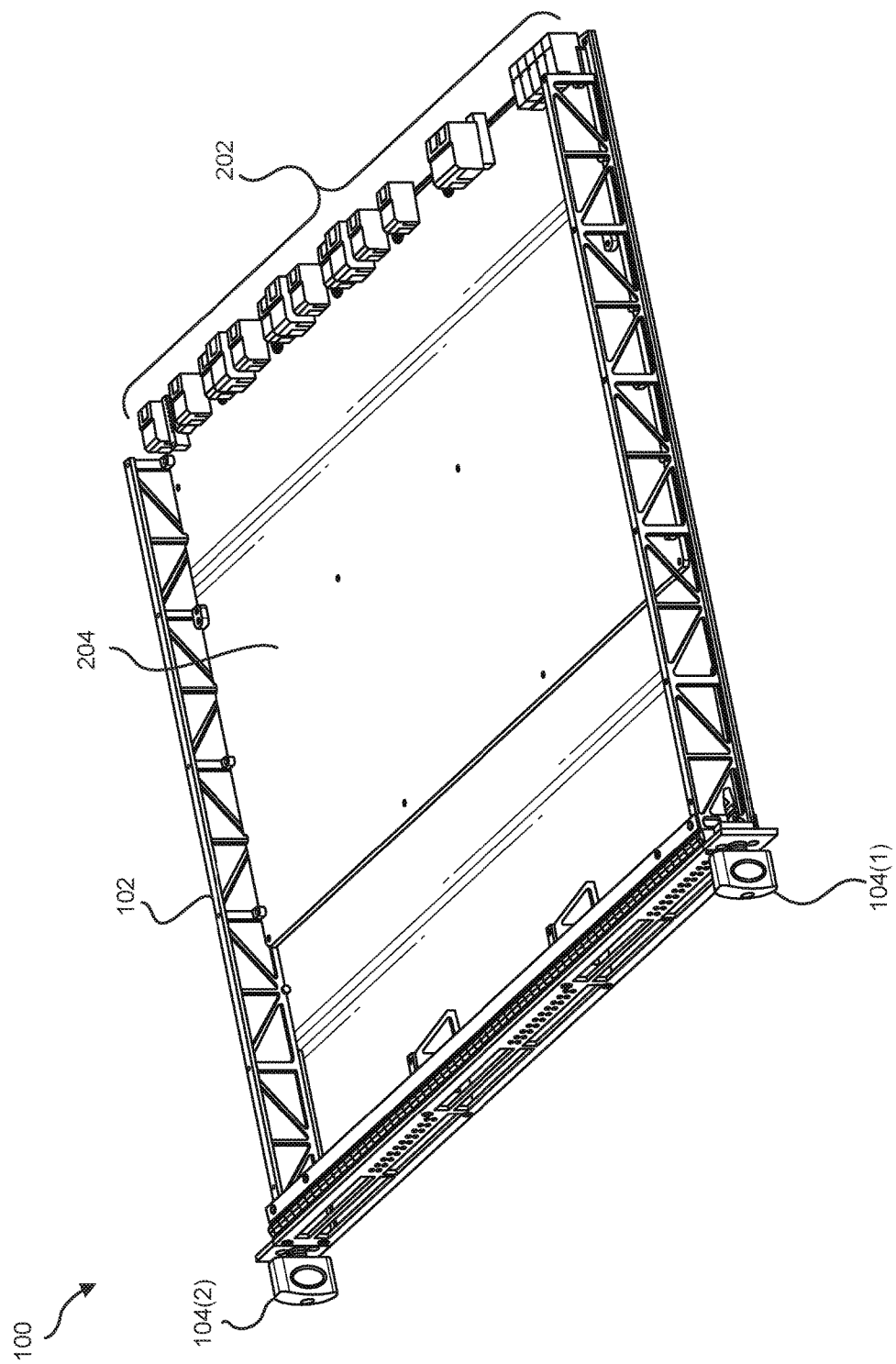
FIG. 2 is an illustration of an exemplary apparatus for preventing demate between FRUs and telecommunications systems.

FIGS. 1 and 2 show an exemplary apparatus 100 for preventing demate between an FRU and a telecommunications system. FIGS. 1 and 2 illustrate apparatus 100 from different perspectives relative to one another. In one example, apparatus 100 may include an FRU 102 that is designed to fit in a slot within a telecommunications system (not illustrated in FIG. 1). In this example, FRU 102 may mate with the backplane of the telecommunications system. Additionally or alternatively, FRU 102 may facilitate communication among computing devices within a network.

The term "field-replaceable unit" and its abbreviation "FRU," as used herein, generally refer to any type or form of modular device that includes one or more ports and/or interfaces that carry and/or forward traffic within a network and/or across multiple networks. Examples of FRU 102 include, without limitation, PICs, FPCs Switch Interface Boards (SIBs), control boards, routing engines, communication ports, fan trays, connector interface panels, routers, switches, portions of one or more of the same, combinations or variations of one or more of the same, and/or any other suitable FRU.

The term "backplane," as used herein, generally refers to any type or form of circuit board and/or signal aggregator that connects certain ports and/or interfaces from various FRUs installed in a telecommunications system. The term "telecommunications system," as used herein, generally refers to any type or form of network device that facilitates the exchange of communications among computing devices. Examples of such a telecommunications system include, without limitation, routers (such as provider edge routers, hub routers, spoke routers, autonomous system boundary routers, and/or area border routers), switches, hubs, modems, bridges, repeaters, gateways, multiplexers, network adapters, network interfaces, network racks, chasses, servers, portions of one or more of the same, combinations or variations of one or more of the same, and/or any other suitable telecommunications system.

As illustrated in FIGS. 1 and 2, apparatus 100 may also include one or more helical ejectors, such as helical ejectors 104(1) and 104(2). The term "helical ejector," as used herein, generally refers to any type or form of physical member, object, and/or shaft that facilitates securing and/or interfacing an FRU with the housing of a telecommunications system by way of helical tightening and/or movement. In one example, helical ejectors 104(1) and 104(2) may each include and/or represent a screw that secures FRU 102 to the housing of the telecommunications system. Additional examples helical ejectors 104(1) and 104(2) include, without limitation, pins, rods, levers, shafts, arms, knobs, portions of one or more of the same, combinations or variations of one or more of the same, or any other suitable ejectors.

In one example, helical ejectors 104(1) and 104(2) may each be physically coupled to FRU 102. In this example, helical ejectors 104(1) and 104(2) may fasten to the housing of the telecommunications system to enable FRU 102 to mate with the backplane of the telecommunications system. In other words, when inserted into the housing of the telecommunications system and tightened, helical ejectors 104(1) and 104(2) may attach and/or secure FRU 102 to the telecommunications system.

In one example, by turning helical ejectors 104(1) and 104(2) in a certain direction, a user may be able to tighten and/or secure FRU 102 to the telecommunications system. In this example, by turning helical ejectors 104(1) and 104(2) in the opposite direction, the user may be able to loosen and/or release FRU 102 from the telecommunications system.

As illustrated in FIG. 2, apparatus 100 may further include connectors 202. The term "connector," as used herein, generally refers to any type or form of full or partial fastener, fitting, receptacle, and/or coupling that facilitates a communicative connection and/or interface between an FRU and a telecommunications system. In some examples, connectors 202 may include and/or represent physical contacts and/or terminals that facilitate the transfer of communications and/or network traffic by way of a communications circuit 204. In one example, communications circuit 204 may facilitate communication among computing devices within a network. In this example, connectors 202 on FRU 102 may attach to and/or interface with corresponding connectors on the backplane of the telecommunications system. In this way, these connectors may establish communicative continuity between FRU 102 and the backplane of the telecommunications system.

In some examples, connectors 202 on FRU 102 may include and/or represent one side of a connection and/or interface. Additionally or alternatively, connectors 202 on FRU 102 may include and/or represent one side of connectors that correspond to and/or mate with another side of those connectors (not illustrated in FIG. 2) on the backplane of the telecommunications system.

In some examples, connectors 202 may include and/or represent electrical connectors that facilitate communication by way of electrical signals. In other examples, connectors 202 may include and/or represent optical connectors that facilitate communication by way of optical signals.

Figure 3:
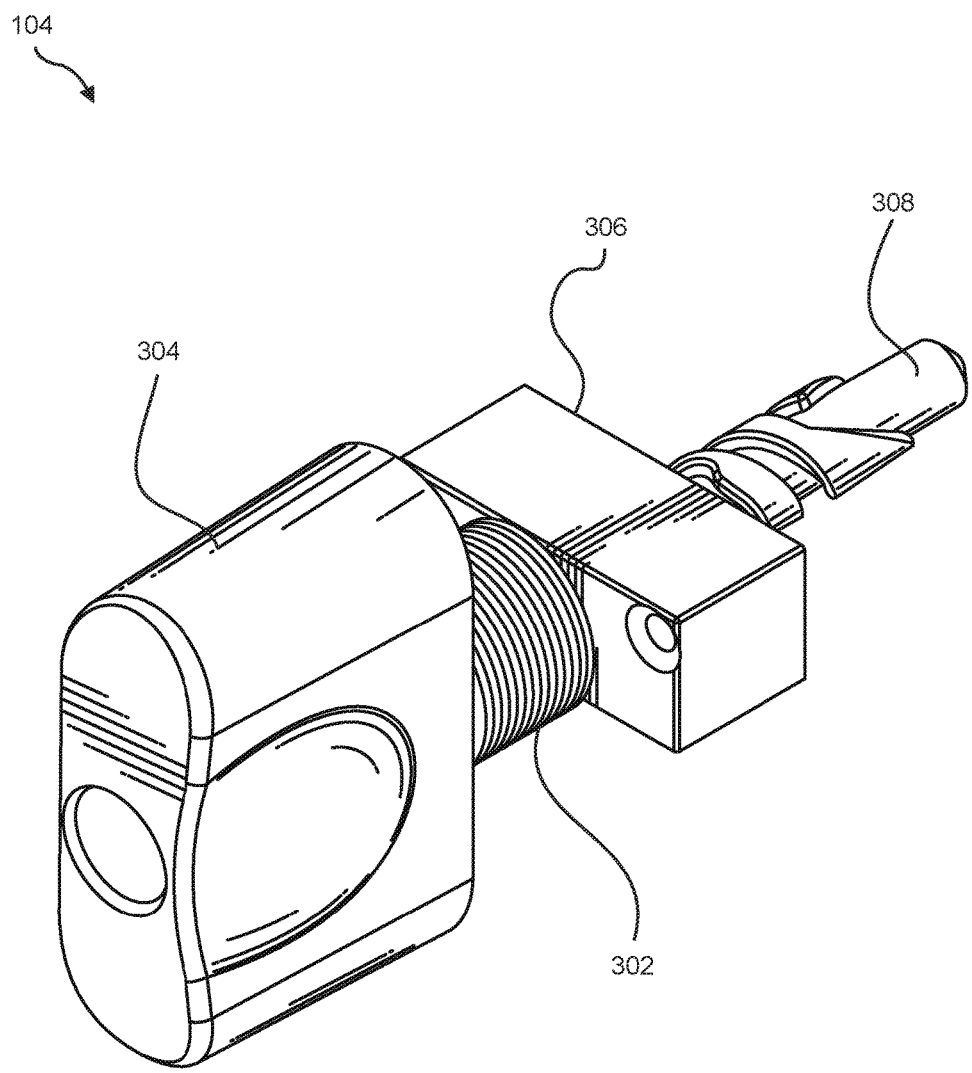
FIG. 3 is an illustration of an exemplary helical ejector that facilitates fastening an FRU to the housing of a telecommunications system.

FIG. 3 shows an exemplary helical ejector 104 for preventing demate between an FRU and a telecommunications system. In one example, helical ejector 104 may include a knob 304. In this example, knob 304 may provide grip and/or leverage that enables a user to turn helical ejector 104. By turning helical ejector 104 in one way via knob 304, the user may be able to tighten and/or secure FRU 102 to the telecommunications system. By turning helical ejector 104 in the opposite way via knob 304, the user may be able to loosen and/or release FRU 102 from the telecommunications system.

As illustrated in FIG. 3, helical ejector 104 may also include a spring 302 that applies force on FRU 102. The term "spring," as used herein, generally refers to any type or form of device, object, and/or mechanism that stores and/or discharges mechanical energy and/or force. In some examples, spring 302 may include and/or represent a set of Belleville disc springs. In one example, this set of Belleville disc springs may be formed by conical washers stacked in series. In another example, this set of Belleville disc springs may be formed by conical washers, some of which are stacked in series and some of which are stacked in parallel. Additional examples of spring 302 include, without limitation, tension springs, extension springs, leaf springs, horseshoe springs, torsion springs, compression springs, coil springs, constant-force springs, gas springs, combinations or variations of one or more of the same, and/or any other suitable spring.

In some examples, spring 302 may be preloaded such that, when helical ejector 104 is fastened to the housing of the telecommunications system, spring 302 applies a force on FRU 102. This force may push FRU 102 toward the backplane of the telecommunications system.

In some examples, the force applied by spring 302 on FRU 102 may cause FRU 102 to fully mate with the backplane of the telecommunications system. In other words, when helical ejector 104 is fastened to the housing of the telecommunications system, the force applied by spring 302 on FRU 102 may prevent FRU 102 from demating from the backplane of the telecommunications system.

Accordingly, spring 302 may maintain and/or keep FRU 102 in a fully mated position with respect to the backplane of the telecommunications system. Additionally or alternatively, spring 302 may engage FRU 102 such that FRU 102 and the backplane of the telecommunications system do not experience any degree of demate that interferes with and/or impairs the signal integrity of communications exchanged between FRU 102 and the backplane of the telecommunications system.

As illustrated in FIG. 3, helical ejector 104 may also include a threaded member 308. In one example, threaded member 308 may be inserted into a corresponding receptacle and/or hole in the housing of the telecommunications system. For example, a user may inject threaded member 308 into the corresponding receptacle and/or hole by turning knob 304 in the tightening direction. Once inserted and/or secured properly into the corresponding receptacle and/or hole, threaded member 308 may provide resistance against movement from and/or with respect to the housing of the telecommunications system. As a result, threaded member 308 may cause helical ejector 104 to remain in place, thus continuing to secure FRU 102 to the housing of the telecommunications system, until a user turns the knob in the loosening direction.

As illustrated in FIG. 3, helical ejector 104 may further include a block 306. In one example, block 306 may provide and/or serve as a stopping point for spring 302. For example, spring 302 may sit and/or be positioned between knob 304 and block 306. In this example, spring 302 may be compressed between knob 304 and block 306 as the user turns knob 304 to tighten helical ejector 104. This compression may cause spring 302 to apply a force that pushes FRU 102 toward the backplane of the telecommunications system.

In one example, spring 302 may envelop and/or slide over threaded member 308 of helical ejector 104. In this example, knob 304 may be added to one side of helical ejector 104, and block 306 may added to the other side of helical ejector such that spring 302 is sandwiched between knob 304 and block 306. Like spring 302, block 306 may envelop and/or slide over threaded member 308 of helical ejector 104.

In one example, block 306 may serve as a coupling point and/or unit at which helical ejector 104 is coupled to FRU 102. In this example, block 306 may be coupled to FRU 102 by screws, solder, adhesive, fasteners and/or any other suitable coupling mechanism. Once block 306 is coupled to FRU 102, the user may secure and/or attach FRU 102 to the housing of the telecommunications system by inserting threaded member 308 into the corresponding receptacle or hole of the housing and then turning knob 304 to tighten.

Figure 4:
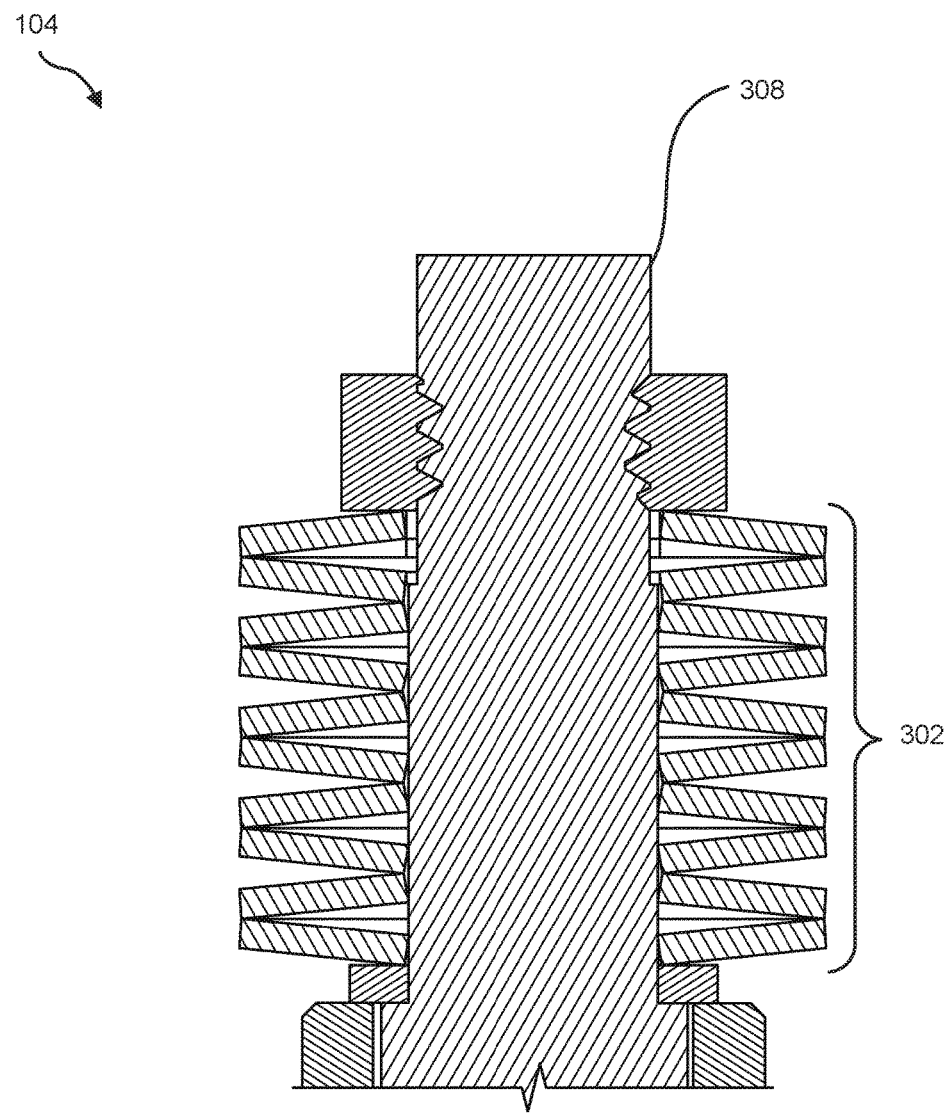
FIG. 4 is an illustration of a portion of an exemplary helical ejector that facilitates fastening an FRU to the housing of a telecommunications system.

FIG. 4 shows a cross sectional view of a portion of exemplary helical ejector 104 for preventing demate between an FRU and a telecommunications system. As illustrated in FIG. 4, helical ejector 104 may include spring 302, which envelops and/or slides over threaded member 308. In this example, spring 302 may include and/or represent a set of Belleville disc washers stacked in series.

In one example, helical ejector 104 may include a knob 304. In this example, knob 304 may provide grip and/or leverage that enables a user to turn helical ejector 104. By turning helical ejector 104 in one way via knob 304, the user may be able to tighten and/or secure FRU 102 to the telecommunications system. By turning helical ejector 104 in the opposite way via knob 304, the user may be able to loosen and/or release FRU 102 from the telecommunications system.

Figure 5:
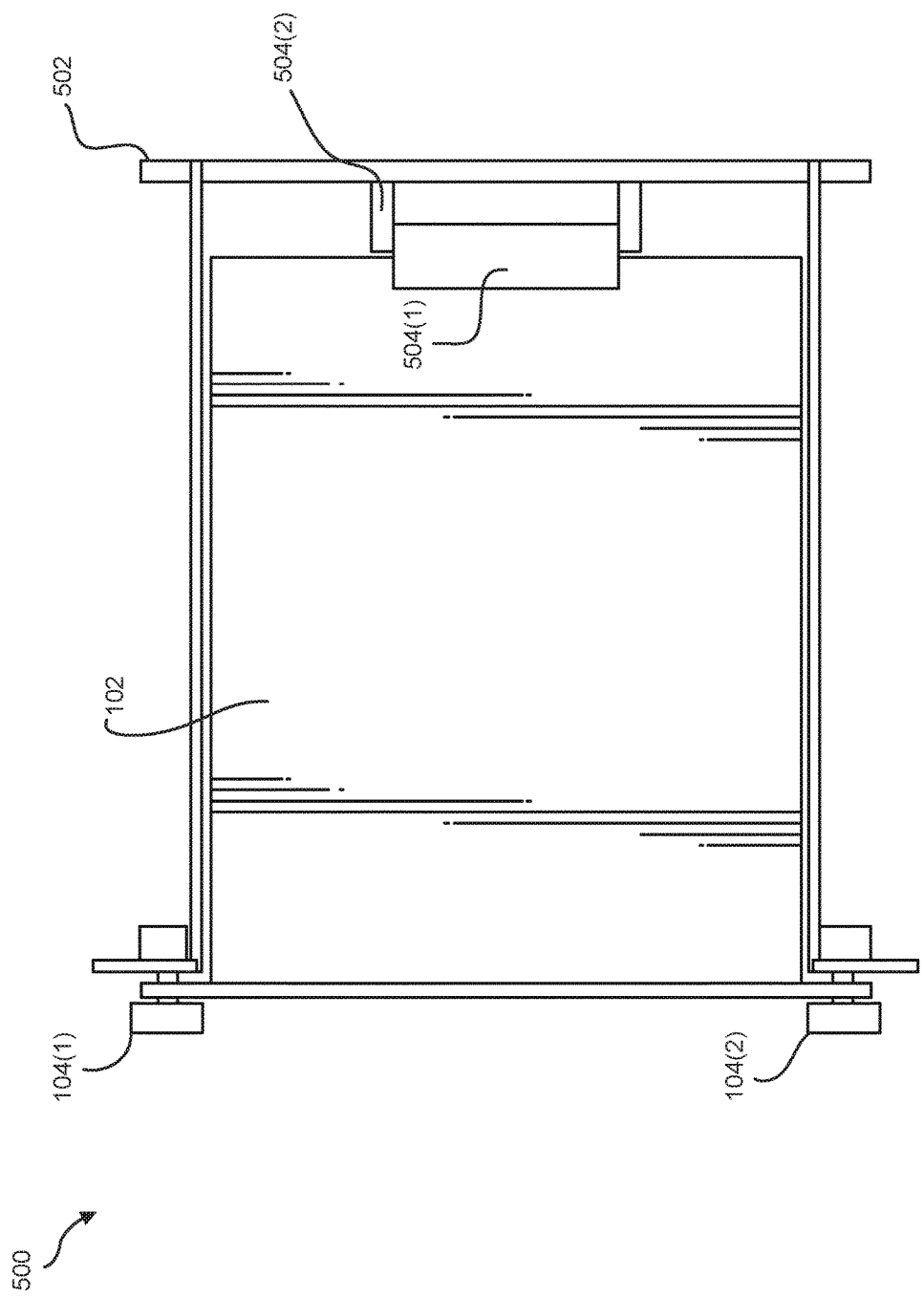
FIG. 5 is an illustration of an exemplary implementation of an apparatus for preventing demate between FRUs and telecommunications systems.

FIG. 5 shows an exemplary implementation 500 of apparatus 100 for preventing demate between an FRU 102 and a telecommunications system. As illustrated in FIG. 5, FRU 102 may mate and/or interface with a backplane 502 of a telecommunications system via connectors 504(1) and 504(2). In one example, connectors 504(1) and 504(2) may be designed to communicatively couple and/or interface FRU 102 with the telecommunications system. In this example, connectors 504(1) and 504(2) may each include and/or represent one side of a connection and/or interface between FRU 102 and the telecommunications system.

Figure 6:
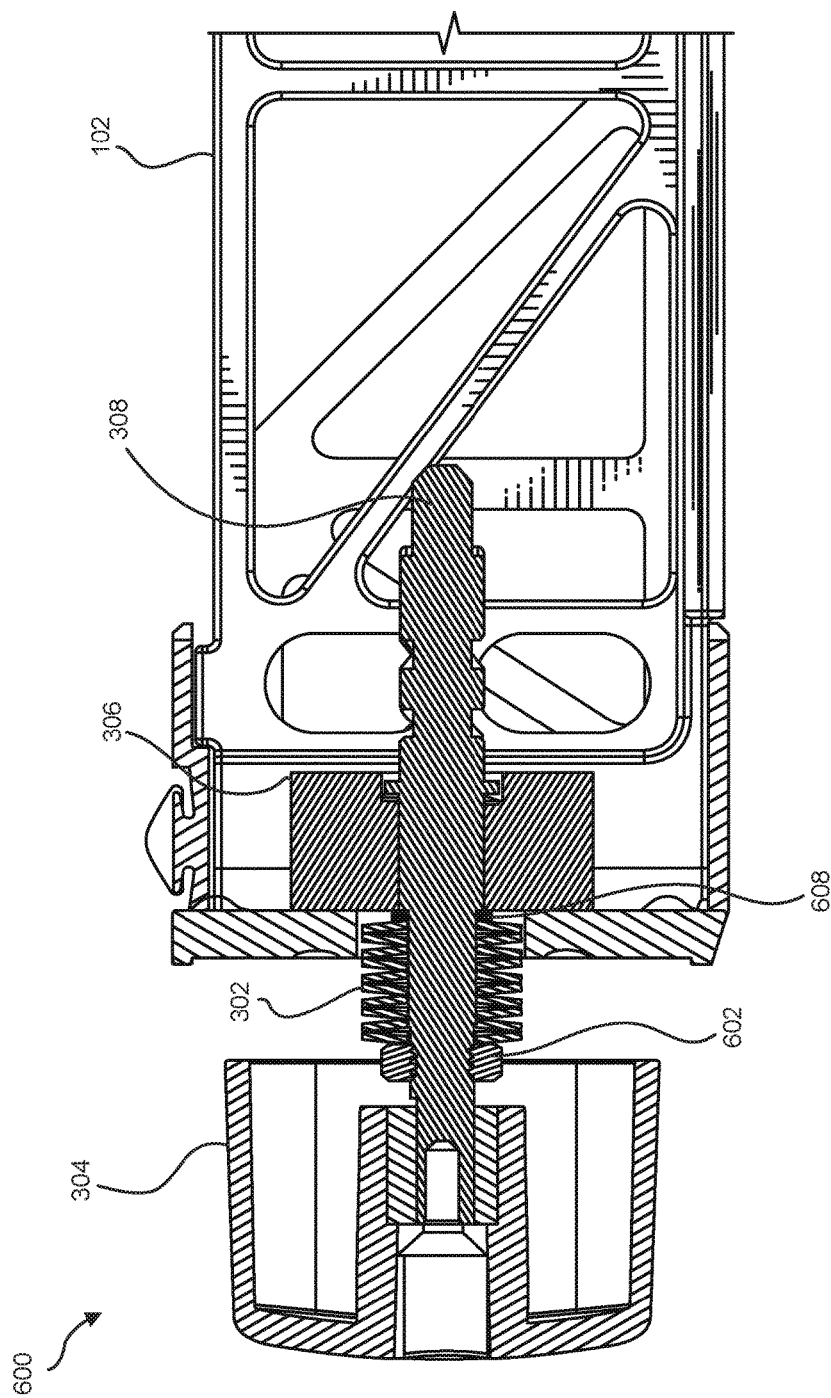
FIG. 6 is an illustration of an exemplary implementation of an apparatus for preventing demate between FRUs and telecommunications systems.

FIG. 6 show an exemplary apparatus 600 for preventing demate between an FRU and a telecommunications system. As illustrated in FIG. 6, apparatus 600 may include FRU 102 that is designed to mate with and/or interface with the backplane of a telecommunications system. In this example, apparatus 600 may also include knob 304, threaded member 308, and block 306. Apparatus 600 may further include spring 302, which sits and/or resides between a nut 602 and a load-transfer washer 608.

In one example, nut 602 may abut and/or be positioned near knob 304. Load-transfer washer 608 may abut and/or be positioned near block 306. In this example, nut 602 and/or load-transfer washer 608 may be used to retain and/or preload spring 302.

Figure 7:
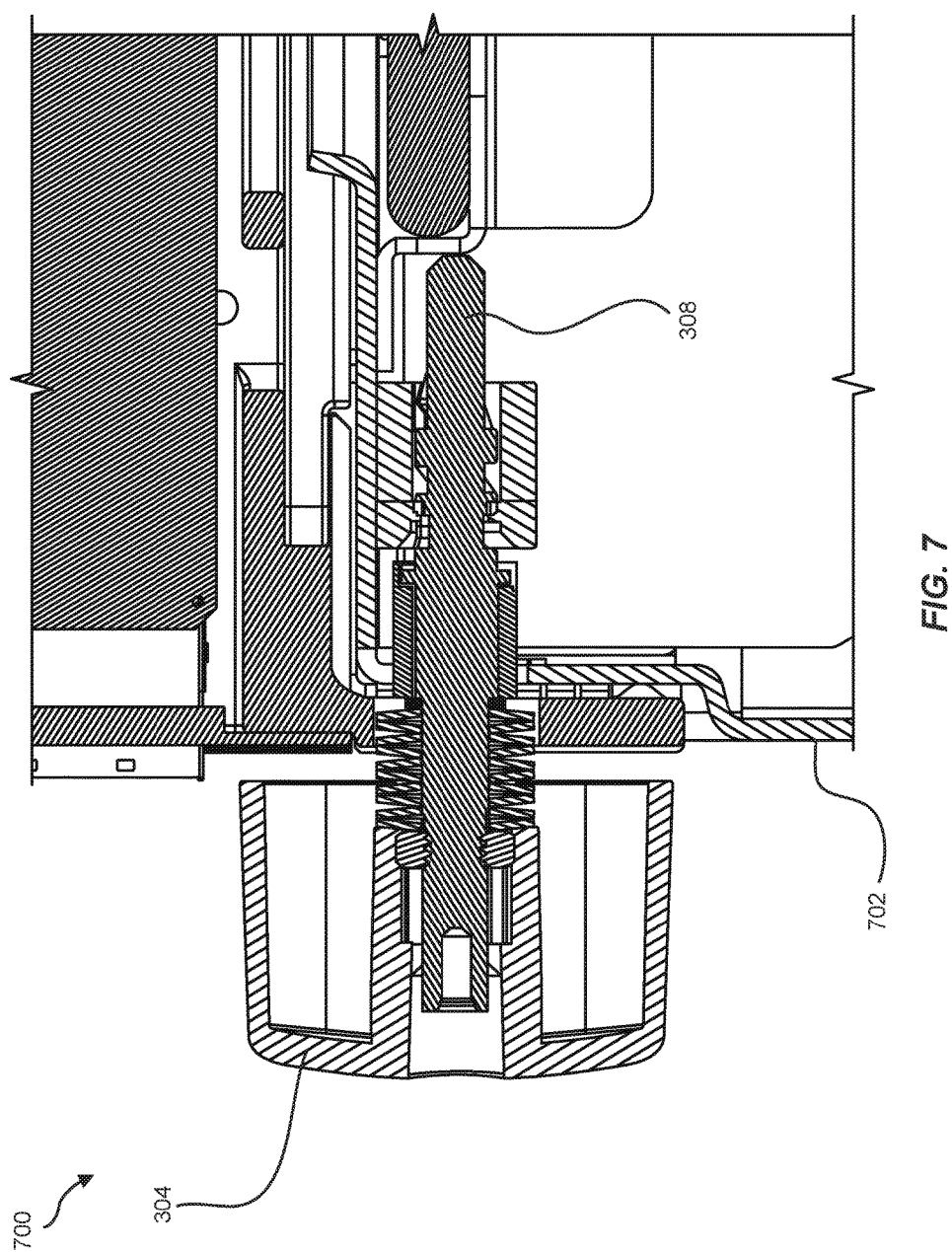
FIG. 7 is an illustration of an exemplary implementation of an apparatus for preventing demate between FRUs and telecommunications systems.
Figure 8:
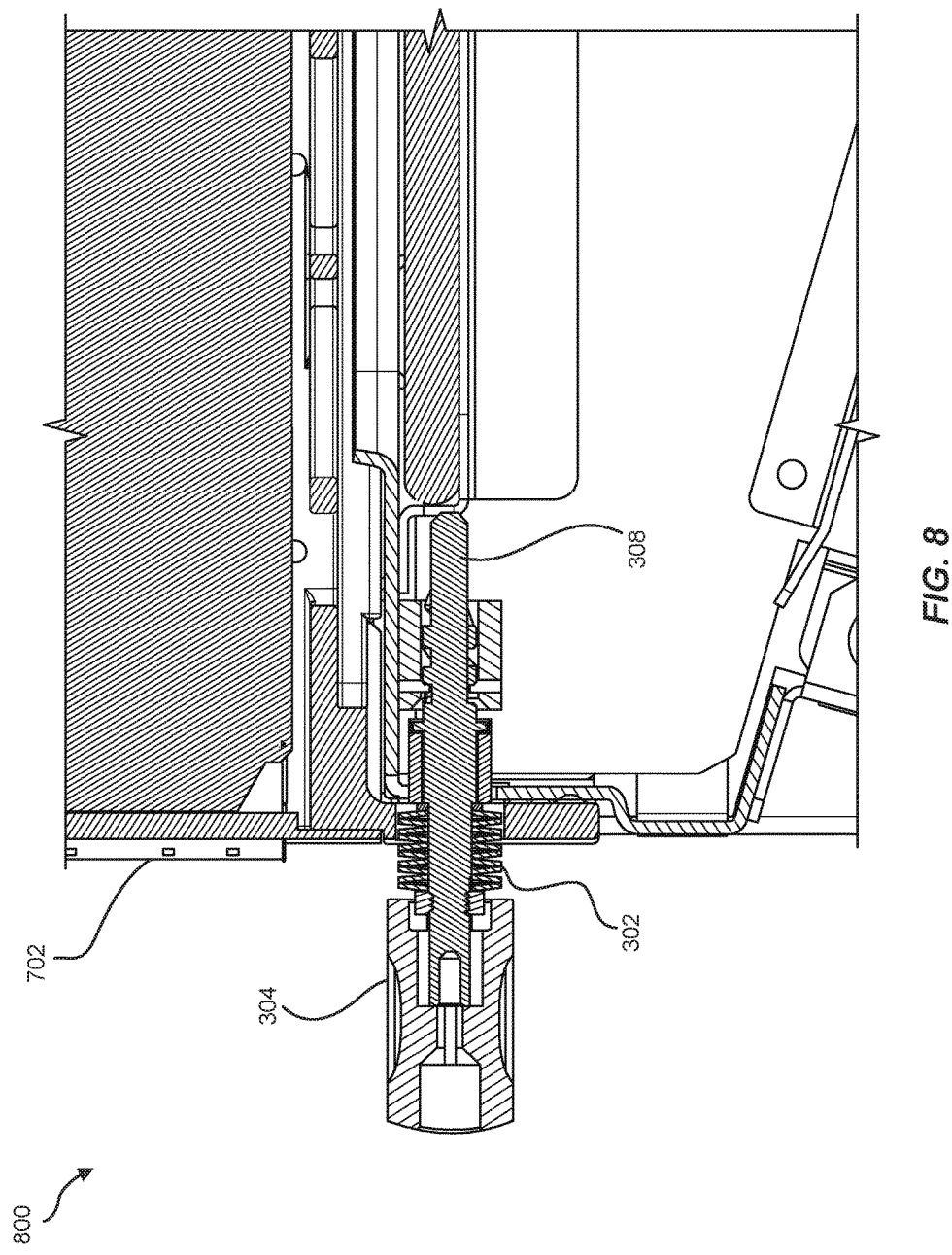
FIG. 8 is an illustration of an exemplary implementation of an apparatus for preventing demate between FRUs and telecommunications systems.

FIGS. 7 and 8 show exemplary implementations 700 and 800, respectively, of apparatus 100 for preventing demate between an FRU and a telecommunications system. FIGS. 7 and 8 illustrate apparatus 100 from cross-sectional perspectives that are different from one another. As illustrated in FIGS. 7 and 8, implementation 700 may involve helical ejector 104 being inserted into and/or secured to a housing 702 of a telecommunications system. In this example, helical ejector 104 may be coupled to FRU 102. Accordingly, by turning helical ejector 104 in one direction via knob 304, a user may be able to tighten and/or secure FRU 102 to the telecommunications system. By turning helical ejector 104 in the opposite direction via knob 304, the user may be able to loosen and/or release FRU 102 from the telecommunications system.

Figure 9:
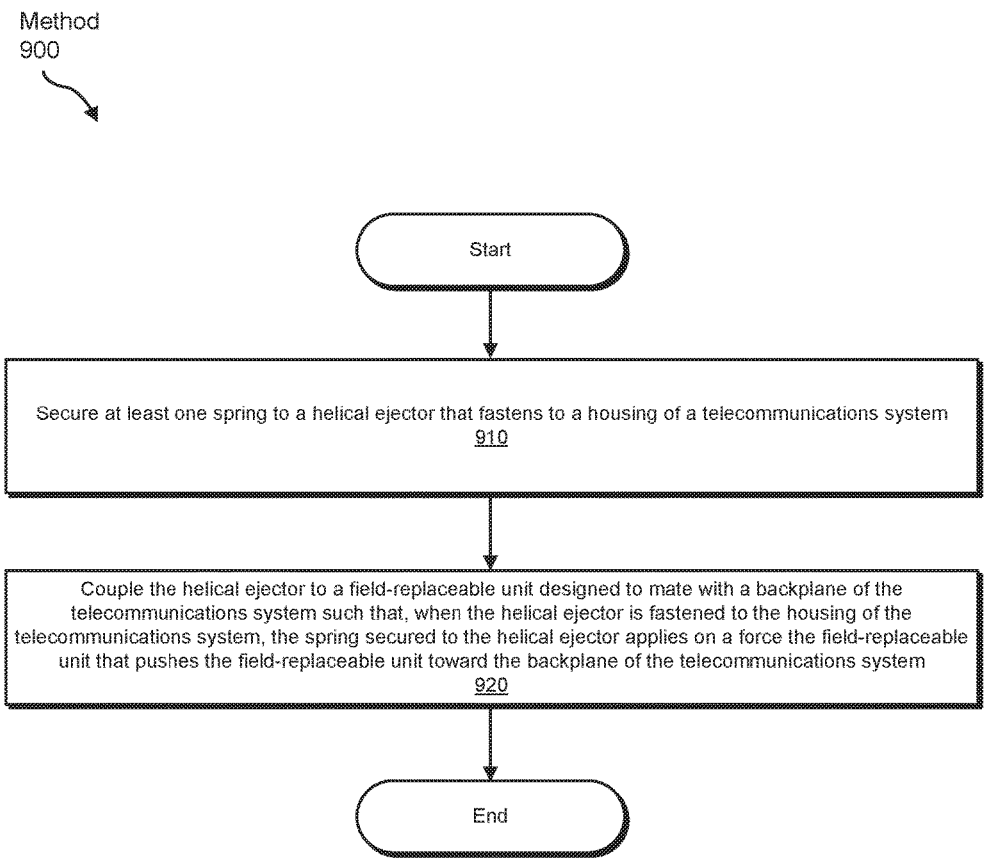
FIG. 9 is a flow diagram of an exemplary method for preventing demate between FRUs and telecommunications systems.

FIG. 9 is a flow diagram of an exemplary method 900 for preventing demate between FRUs and telecommunications systems. As illustrated in FIG. 9, method 900 may include the step of securing at least one spring to a helical ejector that fastens to a housing of a telecommunications system (910). This securing step may be performed in a variety of ways and/or contexts. For example, a telecommunications equipment manufacturer and/or subcontractor may assemble helical ejectors 104(1) and 104(2) in FIG. 1.

In one example, the telecommunications equipment manufacturer and/or subcontractor may place and/or slide spring 302 over threaded member 308. In this example, the telecommunications equipment manufacturer and/or subcontractor may secure spring 302 there with knob 304 on one end and block 306 on the other end. Additionally or alternatively, the telecommunications equipment manufacturer and/or subcontractor may secure spring 302 there with nut 602 on one end and load-transfer washer 608 on the other end.

Returning to FIG. 9, method 900 may also include the step of coupling the helical ejector to an FRU designed to mate with a backplane of the telecommunications system such that, when the helical ejector is fastened to the housing of the telecommunications system, the spring secured to the helical ejector applies a force on the FRU that pushes the FRU toward the backplane of the telecommunications system (920). This coupling step may be performed in a variety of ways and/or contexts. For example, a telecommunications equipment manufacturer and/or subcontractor may manually secure, couple, and/or fix helical ejectors 104(1) and 104(2) to FRU 102.

Once helical ejectors 104(1) and 104(2) are coupled to FRU 102, a user may install FRU 102 into a telecommunications system by inserting FRU 102 into a corresponding slot and then fastening helical ejectors 104(1) and 104(2) to the housing of the telecommunications system. When helical ejectors 104(1) and 104(2) are fastened to the housing in this way, spring 302 may apply a force on FRU 102. This force may push FRU 102 toward the backplane of the telecommunications system. By pushing FRU 102 toward the backplane in this way, the force may effectively prevent demate between FRU 102 and the backplane of the telecommunications system. Accordingly, helical ejectors 104(1) and 104(2) may effectively safeguard, protect, and/or preserve communications and/or signal integrity, thereby improving the performance and/or functionality of FRU 102 and/or the telecommunications systems.

As explained above in connection with FIGS. 1-9, demate between FRUs and backplanes may occur due to engineering tolerances. While such demate may not cause much of a problem at low signal speeds, even small amounts of demate may significantly impair signal integrity at high signal speeds. To address the issue of demate, a telecommunications equipment manufacturer may intentionally overdrive the connector interface between an FRU and the backplane of a telecommunications system, thereby creating an interference condition to eliminate the risk of demate and/or undermate. Unfortunately, this overdriving of the connector interface may damage the FRU and/or backplane in one way or another.

To reduce the risk of damage, the telecommunications equipment manufacturer may add a spring to helical ejectors used to fasten the FRU to the housing of the telecommunications system, thereby effectively creating a spring-loaded FRU. In doing so, the telecommunications equipment manufacturer may incorporate compliance into the ejector system to limit the amount of residual reaction force, thereby mitigating the likelihood of damage to the FRU and/or the backplane. Instead of dealing with an uncontrolled scenario driven by tolerances, this compliant ejector system may apply a force that pushes the FRU toward the backplane of the telecommunications system. However, rather than driving the FRU into an overmated condition and/or position, this compliant ejector system may serve and/or act as a buffer that absorbs any residual reaction force and/or any engineering tolerances to place the FRU into a fully mated condition and/or position.

While the foregoing disclosure sets forth various embodiments using specific illustrations, flowcharts, and examples, each illustration component, flowchart step, operation, and/or component described and/or exemplified herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:
1. An apparatus comprising:
   a field-replaceable unit that:
      is designed to mate with a backplane of a telecommunications system; and
      facilitates communication among computing devices within a network; and
   at least one helical ejector that is coupled to the field-replaceable unit and comprises:
      a shaft;
      a tightening knob coupled to the shaft;
      a spring that envelops the shaft;

a nut that:
  is coupled to the shaft;
  abuts the tightening knob; and
  abuts the spring; and
an ejector block;
wherein:
  the helical elector fastens to a housing of the telecommunications system to enable the field-replaceable unit to mate with the backplane of the telecommunications system; and
  the tightening knob compresses the spring against the ejector block by way of the nut such that the spring applies a force on the field-replaceable unit that pushes the field-replaceable unit toward the backplane of the telecommunications system.

2. The apparatus of claim 1, wherein the force applied by the spring included on the helical ejector causes the field-replaceable unit to fully mate with the backplane of the telecommunications system.

3. The apparatus of claim 1, wherein the force applied by the spring included on the helical ejector maintains the field-replaceable unit in a fully mated position with respect to the backplane of the telecommunications system such that, when the helical ejector is fastened to the housing, the field-replaceable unit does not demate from the backplane of the telecommunications system.

4. The apparatus of claim 1, wherein the spring comprises a set of Belleville disc springs stacked in series.

5. The apparatus of claim 1,
wherein the tightening knob compresses the spring against the ejector block included on the field-replaceable unit to create the force that pushes the field-replaceable unit toward the backplane of the telecommunications system.

6. The apparatus of claim 1, wherein the helical ejector comprises a worm drive that interfaces with a receptacle in the housing of the telecommunications system to:
  facilitate fastening to the housing of the telecommunications system; and
  enable the spring to force the field-replaceable unit to mate with the backplane of the telecommunications system.

7. The apparatus of claim 1, wherein:
  the field-replaceable unit includes a first side of at least one connector;
  the backplane of the telecommunications system includes a second side of the connector; and
  wherein the helical ejector, when fastened to the housing, causes the first side of the connector included on the field-replaceable unit to mate with the second side of the connector included on the backplane of the telecommunications system.

8. The apparatus of claim 7, wherein the force applied by the spring causes the field-replaceable unit to fully mate with the backplane of the telecommunications system such that no air gap exists between the first side of the connector included on the field-replaceable unit and the second side of the connector included on the backplane of the telecommunications system despite any engineering tolerance.

9. The apparatus of claim 7, wherein the force applied by the spring causes the field-replaceable unit to fully mate with the backplane of the telecommunications system such that any air gap that exists between the first side of the connector included on the field-replaceable unit and the second side of the connector included on the backplane of the telecommunications system has a negligible effect on the integrity of signals exchanged between the field-replaceable unit and the backplane of the telecommunications system via the connector.

10. The apparatus of claim 1, wherein the spring is preloaded between the nut and the ejector block such that the force that pushes the field-replaceable unit toward the backplane of the telecommunications system is sufficient to drive the field-replaceable unit into a fully mated position irrespective of any engineering tolerance.

11. A field-replaceable unit comprising:
  a communications circuit that facilitates communication among computing devices within a network;
  at least one connector that facilitates communicatively coupling the communications circuit to a backplane of a telecommunications system; and
  at least one helical ejector that comprises:
    a shaft;
    a tightening knob coupled to the shaft;
    a spring that envelops the shaft;
    a nut that:
      is coupled to the shaft;
      abuts the tightening knob; and
      abuts the spring; and
    an ejector block;
  wherein:
    the helical ejector fastens to a housing of the telecommunications system to enable the connector to communicatively couple the communications circuit to the backplane of the telecommunications system; and
    the tightening knob compresses the spring against the ejector block by way of the nut such that the spring applies a force on the field-replaceable unit that pushes the connector toward the backplane of the telecommunications system.

12. The field-replaceable unit of claim 11, wherein the force applied by the spring included on the helical ejector causes the connector to fully mate with the backplane of the telecommunications system.

13. The field-replaceable unit of claim 11, wherein the force applied by the spring included on the helical ejector maintains the connector in a fully mated position with respect to the backplane of the telecommunications system such that, when the helical ejector is fastened to the housing, the connector does not demate from the backplane of the telecommunications system.

14. The field-replaceable unit of claim 11, wherein the spring comprises a set of Belleville disc springs stacked in series.

15. The field-replaceable unit of claim 11,
wherein the tightening knob compresses the spring against the ejector block to create the force that pushes the connector toward the backplane of the telecommunications system.

16. The field-replaceable unit of claim 11, wherein the helical ejector comprises a worm drive that interfaces with a receptacle in the housing of the telecommunications system to:
  facilitate fastening to the housing of the telecommunications system; and
  enable the spring to force the connector to mate with the backplane of the telecommunications system.

17. The field-replaceable unit of claim 11, wherein:
  the communications circuit includes a first side of the connector;
  the backplane of the telecommunications system includes a second side of the connector; and wherein the helical ejector, when fastened to the housing, causes the first side of the connector included on the communications circuit to mate with the second side of the connector included on the backplane of the telecommunications system.

18. The field-replaceable unit of claim 17, wherein the force applied by the spring causes the first side of the connector to fully mate with the second side of the connector such that no air gap exists between the first side of the connector and the second side of the connector despite any engineering tolerance.

19. The field-replaceable unit of claim 11, wherein the spring is preloaded between the nut and the ejector block such that the force that pushes the connector toward the backplane of the telecommunications system is sufficient to drive the connector into a fully mated position irrespective of any engineering tolerance.

* * * * *